US010163501B2

(12) United States Patent
Tang

(10) Patent No.: US 10,163,501 B2
(45) Date of Patent: *Dec. 25, 2018

(54) APPARATUSES, MEMORIES, AND METHODS FOR ADDRESS DECODING AND SELECTING AN ACCESS LINE

(71) Applicant: Micron Technology, Inc., Boise, ID (US)

(72) Inventor: Stephen H. Tang, Fremont, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 15/684,784

(22) Filed: Aug. 23, 2017

(65) Prior Publication Data

US 2017/0352416 A1 Dec. 7, 2017

Related U.S. Application Data

(63) Continuation of application No. 15/197,539, filed on Jun. 29, 2016, now Pat. No. 9,786,366, which is a (Continued)

(51) Int. Cl.
*G11C 8/00* (2006.01)
*G11C 13/00* (2006.01)
(Continued)

(52) U.S. Cl.
CPC ............ *G11C 13/0023* (2013.01); *G11C 8/08* (2013.01); *G11C 13/004* (2013.01); (Continued)

(58) Field of Classification Search
CPC ... G11C 13/0023; G11C 8/08; G11C 13/0026; G11C 13/0028; G11C 13/004; G11C 13/0069; G11C 8/10
(Continued)

(56) References Cited

U.S. PATENT DOCUMENTS 3,539,823 A 11/1970 Zuk
6,473,359 B1* 10/2002 Mitarashi ............ H03M 1/0624
365/189.05

(Continued)

FOREIGN PATENT DOCUMENTS

CN 1825474 A 8/2006
JP 2009545835 A 12/2009
(Continued)

OTHER PUBLICATIONS

Extended European Search Report dated Jul. 17, 2017 for European Applicaiton No. 14874228.1.
(Continued)

*Primary Examiner* — Huan Hoang
(74) *Attorney, Agent, or Firm* — Dorsey & Whitney LLP

(57) ABSTRACT

Apparatuses, memories, and methods for decoding memory addresses for selecting access lines in a memory are disclosed. An example apparatus includes an address decoder circuit coupled to first and second select lines, a polarity line, and an access line. The first select line is configured to provide a first voltage, the second select line is configured to provide a second voltage, and the polarity line is configured to provide a polarity signal. The address decoder circuit is configured to receive address information and further configured to couple the access line to the first select line responsive to the address information having a combination of logic levels and the polarity signal having a first logic level and further configured to couple the access line to the second select line responsive to the address information having the combination of logic levels and the polarity signal having a second logic level.

20 Claims, 6 Drawing Sheets

Related U.S. Application Data continuation of application No. 14/139,493, filed on Dec. 23, 2013, now Pat. No. 9,390,792.

(51) Int. Cl.
*G11C 8/08* (2006.01)
*G11C 8/10* (2006.01)

(52) U.S. Cl.
CPC ...... *G11C 13/0026* (2013.01); *G11C 13/0028* (2013.01); *G11C 13/0069* (2013.01); *G11C 8/10* (2013.01)

(58) Field of Classification Search
USPC .......................................................... 365/148
See application file for complete search history.

(56) References Cited

U.S. PATENT DOCUMENTS

| | | | |
|---|---|---|---|
| 6,876,596 | B1 | 4/2005 | Kirihara |
| 7,890,892 | B2 | 2/2011 | De Brosse et al. |
| 9,390,792 | B2 * | 7/2016 | Tang ................ G11C 13/0026 |
| 2007/0008804 | A1 | 1/2007 | Lu et al. |
| 2008/0025066 | A1 | 1/2008 | Fasoli et al. |
| 2008/0159052 | A1 | 7/2008 | Yan et al. |
| 2008/0159053 | A1 | 7/2008 | Yan et al. |
| 2010/0177582 | A1 | 7/2010 | Kim et al. |
| 2011/0019495 | A1 * | 1/2011 | Scheuerlein ............ G11C 7/18 365/230.06 |
| 2011/0044090 | A1 | 2/2011 | Terada et al. |
| 2012/0182784 | A1 | 7/2012 | Murooka |
| 2012/0327735 | A1 | 12/2012 | Hendrickson |
| 2013/0039110 | A1 | 2/2013 | Lam et al. |
| 2013/0088911 | A1 | 4/2013 | Nakura et al. |
| 2013/0121056 | A1 | 5/2013 | Liu |
| 2013/0198452 | A1 | 8/2013 | Chen et al. |
| 2013/0322185 | A1 | 12/2013 | Bedarida et al. |
| 2015/0179253 | A1 | 6/2015 | Tang et al. |
| 2016/0307626 | A1 | 10/2016 | Tang |

FOREIGN PATENT DOCUMENTS

| | | |
|---|---|---|
| JP | 2010515200 A | 5/2010 |
| JP | 2013084324 A | 5/2013 |
| KR | 20090057231 A | 6/2009 |
| KR | 20090107518 A | 10/2009 |
| KR | 20130038164 A | 4/2013 |
| WO | 2015099962 A1 | 7/2015 |

OTHER PUBLICATIONS

First Office Action dated Jul. 4, 2017 for Japanese application No. 2016-541512.
International Search Report and Written Opinion for PCT/US2014/068090 dated Mar. 5, 2015.
Kallel, et al., "Bidirectional Sequential Decoding", IEEE Transactions on Information Theory, vol. 43, No. 4, Jul. 1997, 1319-1326.
First Office Action dated Nov. 6, 2017 for Chinese Application No. 201480070653.5.
Notice of Preliminary Rejection dated Dec. 7, 2017 for Korean Application No. 10-2016-7016904.
English Translation of Notice of Preliminary Rejection for KR application No. 10-2016-7016904, dated Aug. 31, 2018, pp. all.

\* cited by examiner

APPARATUSES, MEMORIES, AND METHODS FOR ADDRESS DECODING AND SELECTING AN ACCESS LINE

CROSS-REFERENCE TO RELATED APPLICATION

This application is a continuation of U.S. patent application Ser. No. 15/197,539, filed Jun. 29, 2016, and issued as U.S. Pat. No. 9,786,366 on Oct. 10, 2017 which is a continuation of U.S. patent application Ser. No. 14/139,493, filed Dec. 23, 2013, and issued as U.S. Pat. No. 9,390,792 on Jul. 12, 2016. The aforementioned applications and patents are incorporated herein by reference, in their entirety, for any purpose.

BACKGROUND

Conventional memory systems may comprise a low voltage select line and a high voltage deselect line for accessing a desired word or bit line (generally referred to as memory access lines). A selected memory access line in an array is coupled to the select line, and non-selected memory access lines are coupled to the deselect line. Conventional two transistor decoder circuits used to select memory access lines may comprise a p-channel field effect (PFET) transistor and an n-channel field effect (NFET) transistor. NFET transistors may be advantageous for delivering low voltages, and PFET transistors may be advantageous for delivering high voltages. In the example conventional system described, the circuit works most efficiently when the NFET transistor connects the access line to the select line when activated, and the PFET transistor connects the access line to the deselect line when activated.

However, with some memory technologies, for example, bi-polar resistive RAM, it may be advantageous to allow current to pass through a memory cell in opposite directions during different phases of operation. In these situations, the conventional two-transistor decoder may not deliver current efficiently for all directions of current flow. An additional PFET transistor may be placed in parallel with the NFET transistor, and an additional NFET transistor may be placed in parallel with the PFET transistor to form CMOS transmission gates to improve current efficiency, but this solution would incur two additional transistors and two additional wires per access line. The increase in cost and space required for the conventional decoder architecture may be undesirable in applications where circuit compactness and simplicity are needed.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
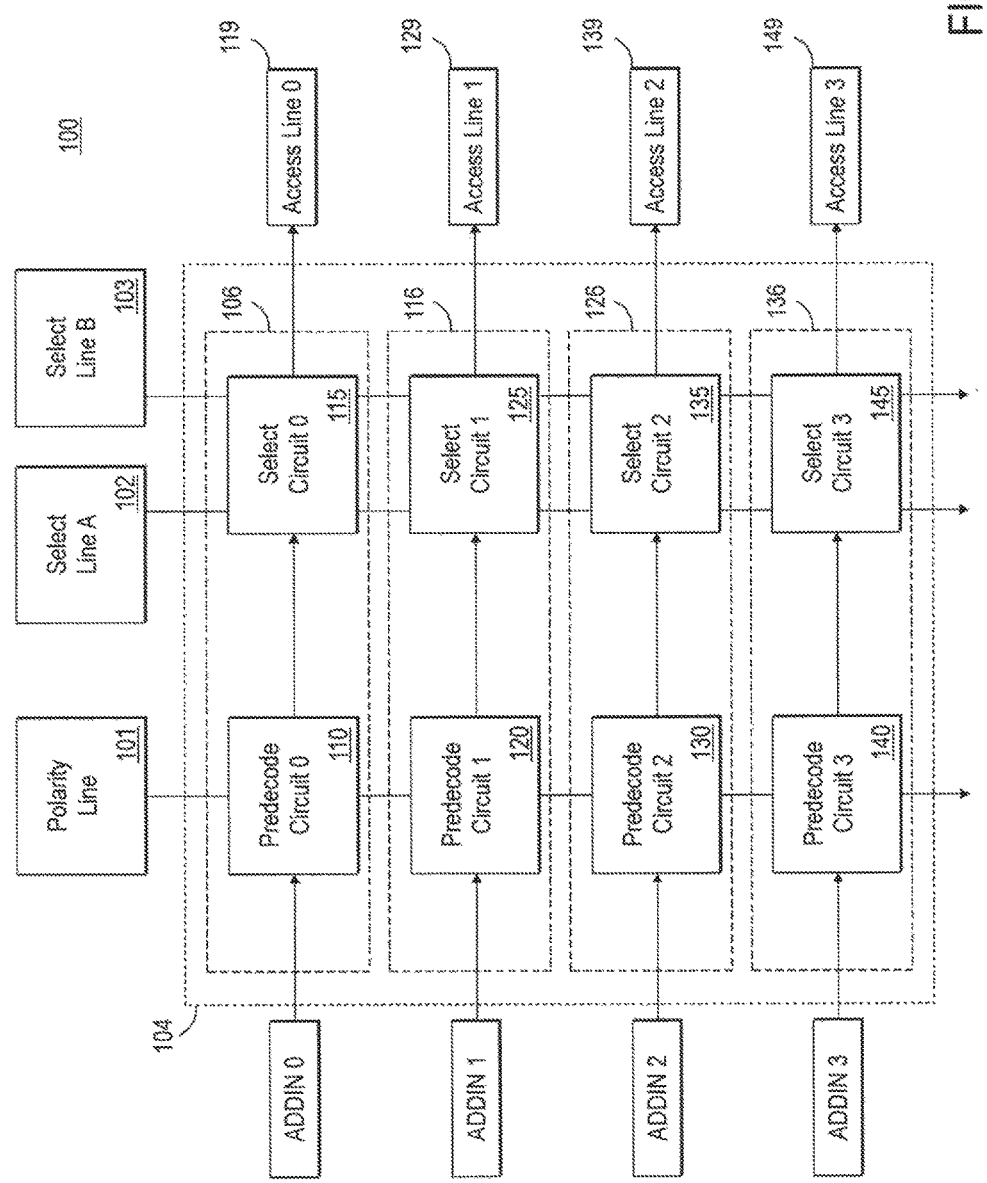
FIG. 1 is a block diagram of an apparatus that includes a direct decoder according to an illustrative embodiment of the disclosure.

FIG. 1 illustrates an apparatus 100 including an address decoder 104 according to an embodiment of the disclosure. The apparatus may be an integrated circuit, a memory device, a memory system, etc. The address decoder 104 may be configured to decode an address to select an access line for activation. The address decoder 104 may include decoder circuits 106, 116, 126, 136 coupled to a respective access line 119, 129, 139, 149. Each decoder circuit 106, 116, 126, 136, is configured to receive respective address information ADDIN0-ADDIN3. The address information ADDIN0-ADDIN3 is based on the address being decoded. Each decoder circuit 106, 116, 126, 136 may comprise a predecode circuit 110, 120, 130, 140, and a select circuit 115, 125, 135, 145. For simplicity, only four decoder circuits and access lines are shown, but more or less may be used. The access lines may be bit lines or word lines of a memory array. In some embodiments, a second address decoder (not shown in FIG. 1) may be included in the apparatus, and configured to decode address information to select an access line of a second set for activation. For example, a first address decoder may be configured to decode address information to select a word line for activation and a second decoder may be configured to decode address information to select a bit line for activation to access a memory cell coupled to the selected word line and bit line.

The select circuits 115, 125, 135, 145 may be coupled to respective access lines 119, 129, 139, 149 and further coupled to select line A 102 and select line B 103. The select line A 102 and select line B 103 may provide respective voltages. Typically, when providing voltages over select line A 102 and select line B 103, one of the voltages is higher than the other voltage. In some embodiments, the voltages of select line A 102 and of select line B 103 may change. The predecode circuits 110, 120, 130, 140 may be coupled to polarity line 101. The polarity line 101 may provide a signal to the predecode circuits 110, 120, 130, 140 to control the coupling of the access lines 119, 129, 139, 149 through the respective select circuit 115, 125, 135, 145 to select lines A and B 102, 103. The predecode circuits 110, 120, 130, 140 may be further configured to activate the select circuits 115, 125, 135, 145 to couple the respective access lines 119, 129, 139, 149 to select line A 102 or select line B 103, for example, based on the respective address information ADDIN0-ADDIN3 and the polarity line 101. In some embodiments, only the selected access line 119, 129, 139, or 149, based on the respective address information ADDIN0-ADDIN3, may be coupled to select line A 102 or select line B 103. The remaining non-selected access lines may be coupled to the remaining select line that is not coupled to the selected access line. The address decoder 104 may be implemented as a direct decoder in an embodiment of the disclosure.

Figure 2:
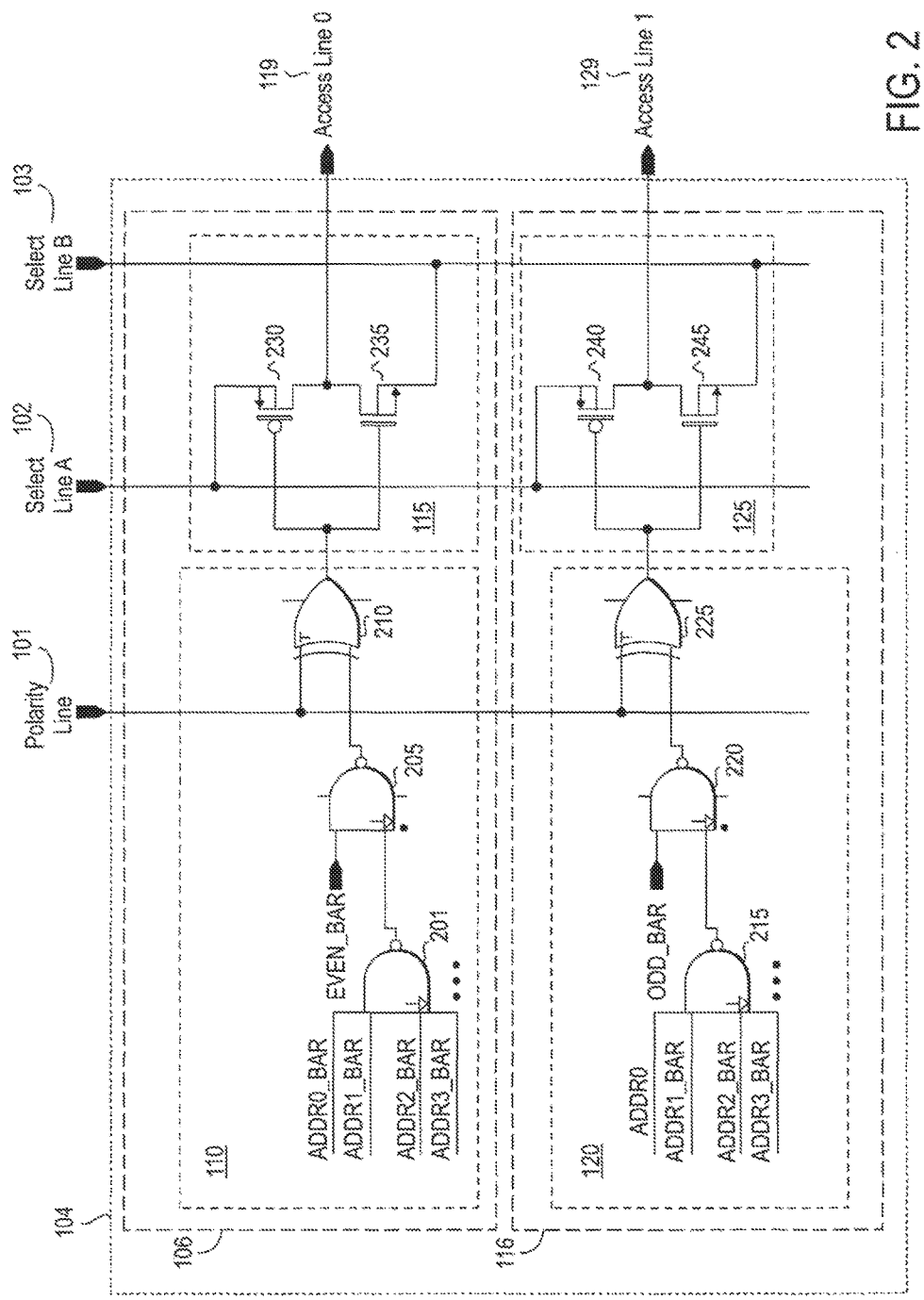
FIG. 2 is a circuit diagram of a decoder according to an illustrative embodiment of the disclosure.

FIG. 2 illustrates a particular illustrative embodiment of address decoder 104. For simplicity, only two decoder circuits 106, 116 and two access lines 119, 129 are shown, but greater or fewer decoder circuits and access lines may be included. Predecode circuit 110 includes a 4-input NAND gate 201 configured to receive address information ADDIN0, represented by a 4-bit address (ADDR0-3_BAR). The output of NAND gate 201 is coupled to an input of a 2-input NAND gate 205. The other input of NAND gate 205 is coupled to control signal EVEN_BAR, which may be used during testing, but is not activated during normal operation. EVEN_BAR is at logic high ("1") during normal operation. The output of NAND gate 205 is coupled to an input of XOR gate 210. The second input of XOR gate 210 is coupled to polarity line 101. The output of XOR gate 210 is coupled to the gates of PFET transistor 230 and NFET transistor 235 of select circuit 115. The drains of transistors 230 and 235 are coupled together. The source of transistor 230 is coupled to select line A 102. The source of transistor 235 is coupled to select line B 103. Access line 119 is coupled to the drains of transistors 230 and 235. Access line 119 will be coupled to select line A 102 when transistor 230 is activated and coupled to select line B 103 when transistor 235 is activated. As shown in FIG. 2, when polarity line 101 is at logic low ("0"), the decoder circuit 106 couples the access line 119 to select line B 103 responsive to decoding an address of "0000", and couples the access line 119 to select line A 102 for other addresses, and the decoder circuit 116 couples the access line 129 to select line B 103 responsive to decoding an address of "1000", and couples the access line 129 to select line A 102 for other addresses.

Similar to predecode circuit 110, predecode circuit 120 includes a 4-input NAND gate 215 configured to receive address information ADDIN1, represented by a 4-bit address (ADDR0, ADDR1-3_BAR). The output of NAND gate 215 is coupled to an input of a 2-input NAND gate 220. The other input of NAND gate 220 is coupled to control signal ODD_BAR, which may be used during testing, but is not activated during normal operation. ODD_BAR is at logic high during normal operation. The output of NAND gate 220 is coupled to an input of XOR gate 225. The second input of XOR gate 225 is coupled to polarity line 101. The output of XOR gate 225 is coupled to the gates of PFET transistor 240 and NFET transistor 245 of select circuit 125. The drains of transistors 240 and 245 are coupled together. The source of transistor 240 is coupled to select line A 102. The source of transistor 245 is coupled to select line B 103. Access line 129 is coupled to the drains of transistors 240 and 245. Access line 129 will be coupled to select line A 102 when transistor 240 is activated and coupled to select line B 103 when transistor 245 is activated.

The foregoing description is only one possible implementation of the disclosure. The disclosure may be implemented with alternative logic gates and transistor types without departing from the scope of the present disclosure. Certain examples of circuit operation will now be described. The examples described below are provided to enhance understanding of the present disclosure. The examples should not be considered to be limiting in scope of the present disclosure.

In a first example, the address to be decoded is "0000", which when decoded will cause access line 119 to be selected. As a result of the "0000" address, address information ADDR0_BAR, ADDR1_BAR, ADDR2_BAR, and ADDR3_BAR provided to the NAND gate 201 is "1111," and the address information ADDR0, and ADDR1-3_BAR provided to the NAND gate 215 is "0111". As previously discussed, decoding an address of "0000" will result in address information that will cause the decoder circuit 106 to select the access line 119. Control signals EVEN_BAR and ODD_BAR are also at logic high. Polarity line 101 is set to logic low. Also in the present example, the voltage of select line A 102 is greater than the voltage of select line B 103.

Due to the "1111" provided to the NAND gate 201, the NAND gate 201 provides a logic low output, and the output of NAND 205 is logic high. When the output of NAND gate 205 is logic high, and polarity line 101 is logic low, the output of XOR gate 210 is logic high. The logic high output of the XOR gate 210 activates NFET transistor 235 to couple the access line 119 to select line B 103. Referring to predecode circuit 120, due to the "0111" provided to the NAND gate 215, the output of NAND gate 215 is logic high. Again, ODD_BAR is logic high. Consequently, the output of NAND gate 220 is logic low. The polarity line, as previously discussed is also logic low. When both inputs are logic low, the output of XOR gate 225 is also logic low. The logic low output of the XOR gate 225 activates PFET transistor 240 to couple the access line 129 to select line A 102.

An example where the coupling of the access lines to the select line A 102 and select line B 103 through the respective select circuits is reversed will now be described. While the address information provided to the NAND gates 201 and 215, and the logic level output by NAND gates 205 and 220 remain the same as previously described, the polarity line 101 is now set to a logic high. That is, the output of NAND gate 201 is still logic low, and the output of NAND gate 205 is still logic high. However, because the polarity line 101 is at a logic high, now both inputs to XOR gate 210 are logic high, and as a result, the output of XOR gate 210 is logic low. This activates PFET transistor 230, and access line 119 is coupled to select line A 102. Referring again to precode circuit 120, the output of NAND gate 215 is still logic high due to the "0111" provided to the NAND gate 215, and NAND gate 220 is still logic low. With the polarity line 101 a logic high, the output of XOR gate 225 is logic high. This activates NFET transistor 240, and access line 129 is coupled to select line B 103. As illustrated by the previous example, the access line 119 is switched from being coupled to select line B 103 to being coupled to select line A 102, and the access line 129 is switched from being coupled to select line A 102 to being coupled to select line B 103. The address decoder 104 may change which of the select lines the respective access line is coupled through the use of the polarity line 101. The XOR gate 210 may conditionally invert the output signal of the NAND gate 205 based on the logic level of the polarity line 101, thus, changing which of the transistors of the select circuit are activated when the address information causes the NAND gate 205 to provide an active output signal to the XOR gate. PFET transistors, such as the transistor 230 of the select circuit, are typically more suited for providing a higher voltage from a source to a lower voltage at a drain, and NFET transistors, such as the transistor 235 of the select circuit, are typically more suited for providing a lower voltage from a source to a higher voltage at a drain. Changing a voltage to be provided to an access line may be more efficiently handled by switching hick of the transistors of the select circuit is activated during operation.

For example, continuing from the previous example of providing an address "0000" for decoding and a logic low provided on the polarity line 101, a "1111" is provided to the NAND gate 201 of the decoder circuit 106 causing the XOR gate 210 to provide a logic high signal to activate the NFET transistor 235 and couple the access line 119 to the select line B 103, and a "0111" is provided to the NAND gate 215 of the decoder circuit 116 causing the XOR gate 225 to provide a logic low signal to activate the PFET transistor 240 and couple the access line 129 to select line A 102. As previously discussed, the voltage of select line A 102 is greater than the voltage of select line B 103 in the previous example. Changing the select line coupled to the access lines may be accomplished by changing the logic level of the polarity line 101 from a logic low to logic high, which switches the output of the XOR, gate 210 from logic high to logic low, and switches the output of the XOR gate 225 from logic low to logic high. As a result, the access line 119 is coupled to the select line A 102 and is provided the higher voltage through PFET transistor 230 and the access line 129 is coupled to the select line B 103 and is provided the lower voltage through NFET transistor 245.

Changing to which of the select lines the access line is coupled may be used to perform memory operations that may involve switching a polarity across a memory cell. For example, in some embodiments, the access lines 119, 129 may be word lines. Similar circuits to decoder circuits 106 and 116 may exist for the bit lines. The corresponding circuitry for the bit lines is not shown in FIG. 2. Operation of the decoder circuits coupled to the word lines and the decoder circuits coupled to the bit lines may be coordinated such that the voltage across a selected memory cell may be switched, which causes current to flow through memory elements in different directions. As previously discussed, in some embodiments, the voltages of select line A 102 and of select line B 103 may change, for example, during operation, which may provide greater flexibility in providing different voltages or changing voltages provided to the access lines.

In typical memory arrays, many access lines, often on the order of 1,000 are implemented. More efficient decoder circuitry is desirable to reduce the number of components and the area required by the circuit. A hierarchical decoding structure may be implemented to reduce the number of components required in the decoder circuit. Embodiments of the present disclosure may also be included in a hierarchical decoding structure. This may be desirable to amortize the overhead of the circuitry that allows for the switching of the coupling of access lines to the select lines.

Figure 3:
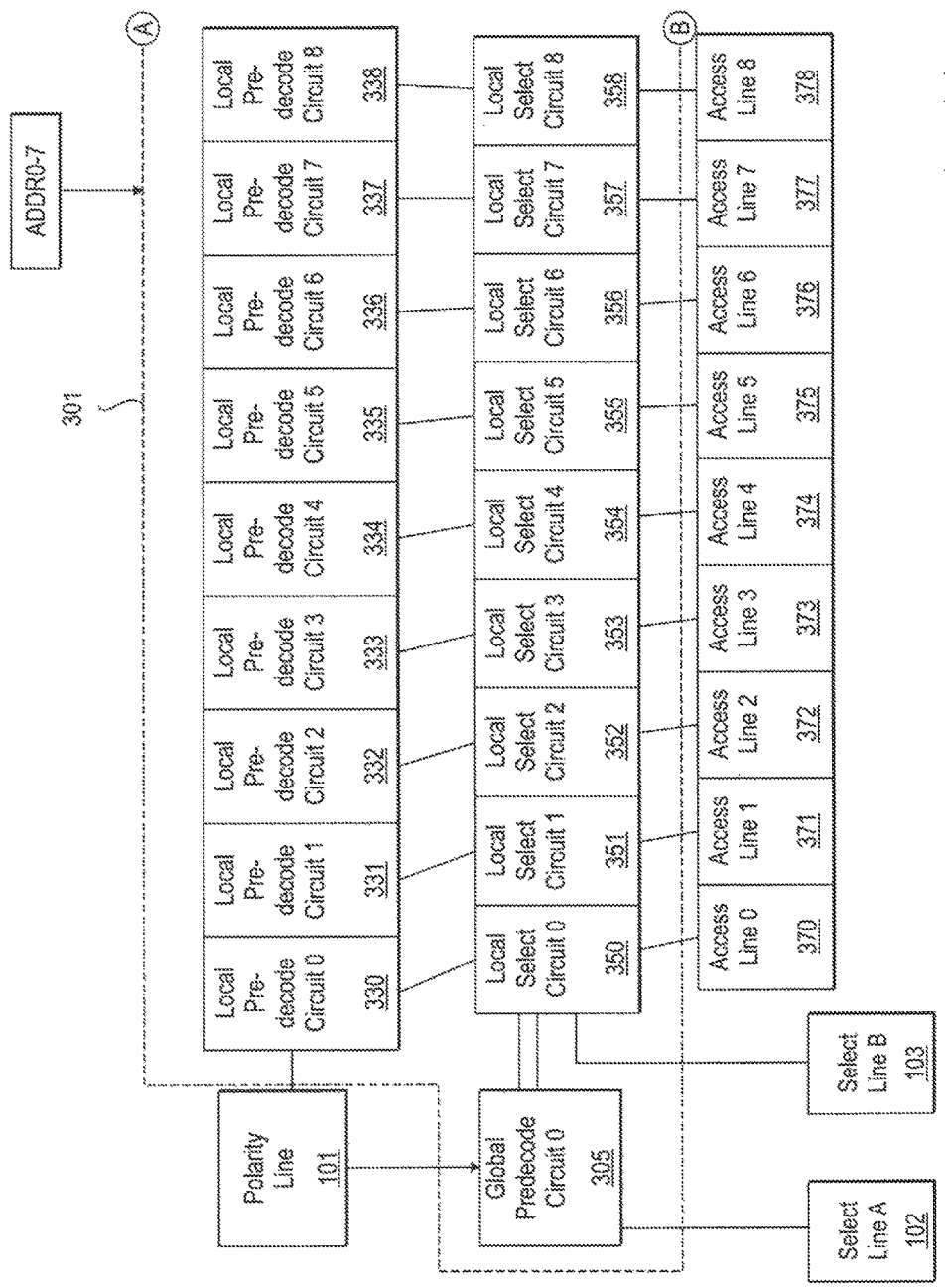
FIG. 3(1)-3(2) is a block diagram of a hierarchical decoder according to an illustrative embodiment of the disclosure.
Figure 3:
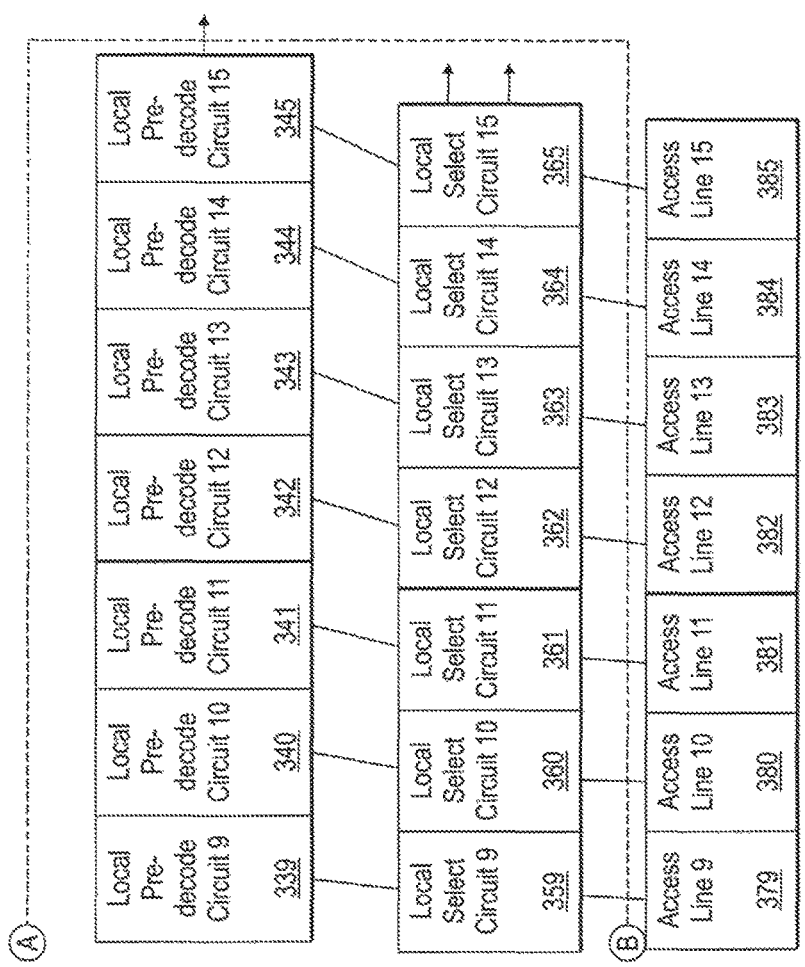

FIG. 3(1)-3(2) is a block diagram of a hierarchical address decoder 301 according to an illustrative embodiment of the disclosure. The current embodiment is described with respect to an 8-bit address (ADDR0-ADDR7) provided to the address decoder 301, allowing for decoding of up to 256 access lines. However, an address of a different number of bits, and for a different number of access lines may be used without departing from the scope of the disclosure. One of ordinary skill in the art will appreciate that this will alter the number of predecode circuits for decoding addresses. The hierarchical address decoder 301 may include sixteen local predecode circuits and sixteen global precode circuits. The local predecode circuits 330-345 may receive the four least significant bits of an address (ADDR0-3) to provide address information. The local predecode circuits 330-345 may be coupled to polarity line 101. Each local predecode circuit may be further coupled to a respective local select circuit 350-365. Each local predecode circuit may be further coupled to 15 other local select circuits (not shown). For example, local predecode circuit 0 330 may be coupled to local select circuit 0 350, local select circuit 16 (not shown), local select circuit 32 (not shown), etc. Local predecode circuit 1 331 may be coupled to local select circuit 1 351, local select circuit 17 (not shown), local select circuit 33 (not shown), etc. The local predecode circuits 2-15 332-345 may be similarly coupled. The global predecode circuit 305 may receive other bits of the address, and may also be coupled to polarity line 101. The global predecode circuit 0 305 may be further coupled to local select circuits 350-365. Fifteen additional global predecode circuits (not shown) may be included and coupled to the local select circuits. For example, local select circuits 0-15 350-365 may be coupled to global circuit 0 305, local select circuits 16-31 (not shown) may be coupled to global predecode circuit 1 (not shown), local select circuits 32-47 (not shown) may be coupled to global predecode circuit 2, etc. Each local select circuit 350-365 may be coupled to select line A 102 and select line B 103. Each local select circuit may be further coupled to a respective access line 370-385.

By implementing a hierarchical decoding structure, the number of predecode circuits may be reduced from 256 to 32. Greater efficiency may be achieved by adding additional levels to the hierarchy for larger numbers of access lines without departing from the scope of the disclosure.

Figure 4:
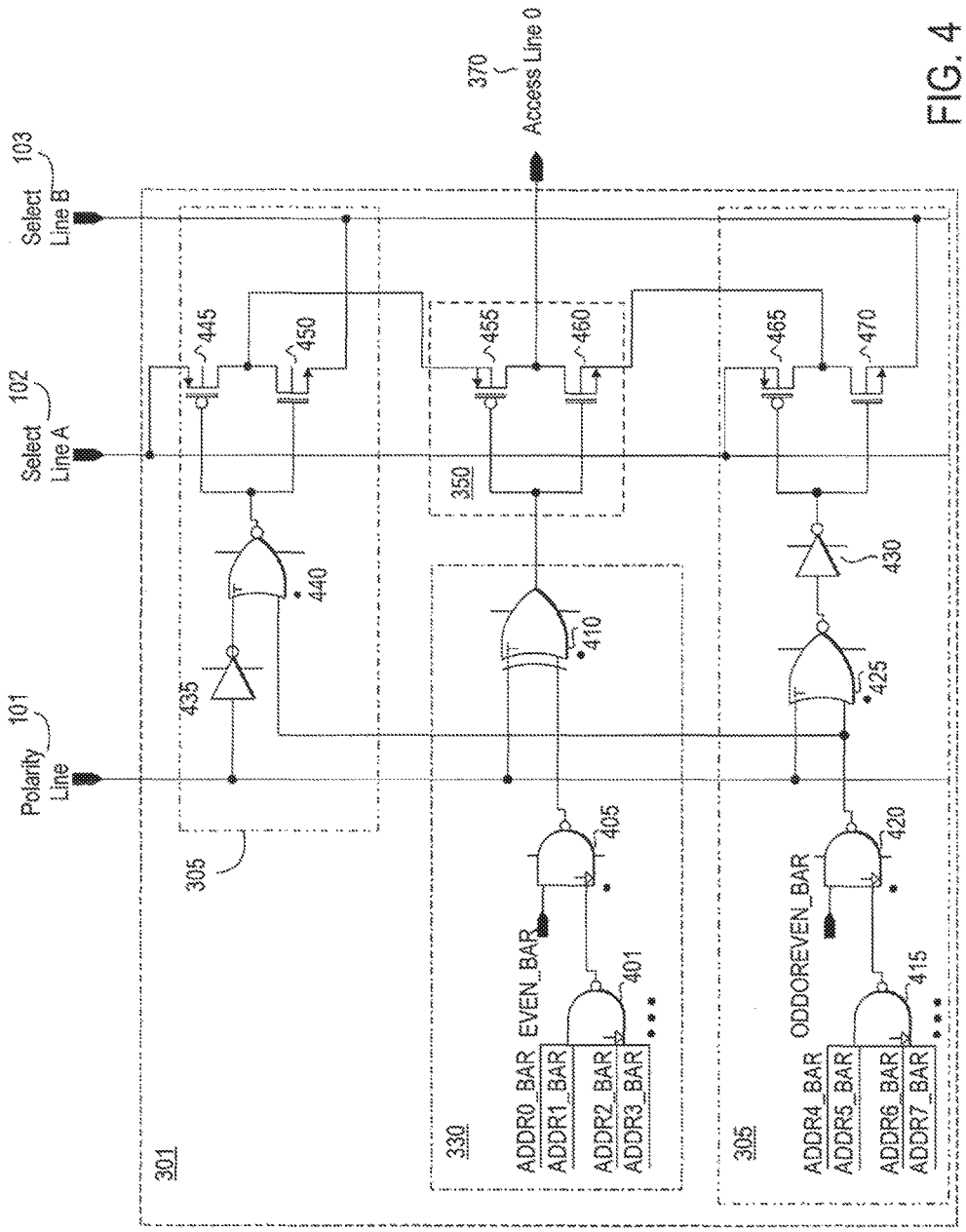
FIG. 4 is a circuit diagram of a hierarchical decoder according to an illustrative embodiment of the disclosure.

FIG. 4 is a circuit diagram of a hierarchical address decoder 301 according to an illustrative embodiment of the disclosure. For clarity, the circuitry for selecting a single access line 370 is shown, but may be replicated for other access lines as well. Address information, represented in FIG. 4 as ADDR0-3_BAR, is received at the input of NAND gate 401. The output of NAND gate 401 is coupled to NAND gate 405. The second input of NAND gate 405 is coupled to control signal EVEN_BAR, which may be used during testing, but is not activated during normal operation. EVEN_BAR is at logic high during normal operation. The output of NAND gate 405 is coupled to the input of XOR gate 410. The other input of XOR gate 410 is coupled to polarity line 101. The output of XOR gate 410 is coupled to the gates of PFET transistor 455 and NFET transistor 460 in local select circuit 350. The drains of transistors 455 and 460 are coupled together and to access line 370. The source of transistor 455 is coupled to the drains of PFET transistor 445 and NFET transistor 450. The source of transistor 460 is coupled to the drains of PFET transistor 465 and NFET transistor 470.

Global predecode circuit 305 receives address information, represented in FIG. 4 as ADDR4-7_BAR at the input of NAND gate 415. The output of NAND gate 415 is coupled to the input of NAND gate 420. The other input of NAND gate 420 is coupled to control signal ODDOR-EVEN_BAR, which may be used during testing, but is not activated during normal operation. ODDOREVEN_BAR is at logic high during normal operation. The output of NAND gate 420 is coupled to the inputs of NOR gate 425 and NOR gate 440. The second input of NOR gate 425 is coupled to polarity line 101. The output of NOR gate 425 is coupled to the input of inverter 430. The output of inverter 430 is coupled to the gates of transistors 465 and 470. The drains of transistors 465 and 470 are coupled to each other, and as mentioned above, are coupled to the source of transistor 460. The source of transistor 465 is coupled to select line A 102, and the source of transistor 470 is coupled to select line B 103. Returning to NOR gate 440, the second input is coupled to the output of inverter 435. The input of inverter 435 is coupled to polarity line 101. The output of NOR gate 440 is coupled to the gates of transistors 445 and 450. The drains of transistors 445 and 450 are coupled to each other and to the source of transistor 455. The source of transistor 445 is coupled to select line A 102 and the source of transistor 450 is coupled to select line B 103.

The disclosure may be implemented with alternative logic gates and transistor types without departing from the scope of the present disclosure. Certain examples of circuit operation will now be described. The examples described below are provided to enhance understanding of the present disclosure. The examples should not be considered to be limiting in scope of the present disclosure.

In a first example, the address "0000 0000" is to be decoded. The 0000 0000 address corresponds to access line 370. That is, the access line 370 is selected by the address 0000 0000. ADDR0_BAR, ADDR1_BAR, ADDR2_BAR, ADDR3_BAR, ADDR4_BAR, ADDR5_BAR, ADDR6_BAR, and ADDR7_BAR are all logic high (e.g., "1111 1111"). EVEN_BAR and ODDOREVEN_BAR are also logic high, and polarity line 101 is set to logic low.

Referring to local predecode circuit 330, the output of NAND gate 401 is logic low. As mentioned above, EVEN_BAR is logic high ("1"), therefore, the output of NAND gate 405 is logic high. With the polarity line 101 logic low, the output of XOR gate 410 is logic high. The output of the XOR gate 410 activates NFET transistor 460. Access line 370 is coupled to the drains of transistors 465 and 470.

Referring to global predecode circuit 305, the output of NAND gate 415 is logic low. ODDOREVEN_BAR is logic high, therefore the output of NAND gate 420 is logic high. The output of NOR gate 425 is logic low, which is inverted by inverter 430. Therefore, the signal provided to transistors 465, 470 is logic high, and NFET transistor 470 is activated. As mentioned above, NFET transistor 460 is also activated causing access line 370 to be coupled to select line B 103. Returning to NOR gate 440, it receives the logic high from NAND gate 420. The logic low of polarity line 101 is inverted by inverter 435, such that the inputs to NOR gate 440 are both logic high. This causes the output of NOR gate 440 to be logic low, activating PFET transistor 445. However, because PFET transistor 455 is not activated, the voltage of select line A 102 is not provided to the access line 370.

An example where the coupling of access line 370 to a select line is reversed, will now be described. The logic level of the polarity line 101 is changed from logic low to logic high. The output of the NAND gate 405 and the output of NAND gate 420 are still at logic high. In this example, the output of XOR gate 410 will be logic low, and PFET transistor 455 will be activated. Access line 370 will be coupled by PFET transistor 455 to the drains of transistors 445 and 450. The output of NOR gate 425 is logic low and is inverted by inverter 430. Therefore, the signal provided to the transistors 465, 470 is logic high, and NFET transistor 470 is activated. However, because transistor 460 is not activated, the voltage of select line B 103 is not provided to the access line 370. Returning to NOR gate 440, it receives the logic high from NAND gate 420. With the polarity line 101 set to a logic high, and inverted by inverter 435, the input to NOR gate 440 is logic low. Thus the output of NOR gate 440 is logic low, activating PFET transistor 445. As mentioned above, PFET transistor 455 is also activated causing access line 370 to be coupled to select line A 102.

In some embodiments, the ability to switch to which select line an access line is coupled without deselecting or further re-selecting the access line may provide greater flexibility in providing different voltages or changing voltages provided to the access lines. As described in the above example, the select line coupled to the access line may be switched by changing the logic signal on the polarity line 101, which alters which transistors are activated. The address decoder 301 may not need to wait for a new address to decode and switch to which select line the selected access line is coupled.

In the above example, access line 370 may be one of a plurality of word lines. Similar circuits to local predecode circuit 330, global predecode circuit 305, and local select circuit 350 may exist for a plurality of bit lines. For clarity, the corresponding circuitry for the bit lines is not shown. When the coupling of the access line 370 to the select lines is switched, and polarity line 101 is switched from logic low to logic high, the coupling of the bit lines to the select lines may also be reversed. The result of this coordinated reversal of polarity of select lines for both the word lines and bit lines, aided by the global signal polarity line 101, is that current may be able to efficiently flow through memory elements in different directions.

Figure 5:
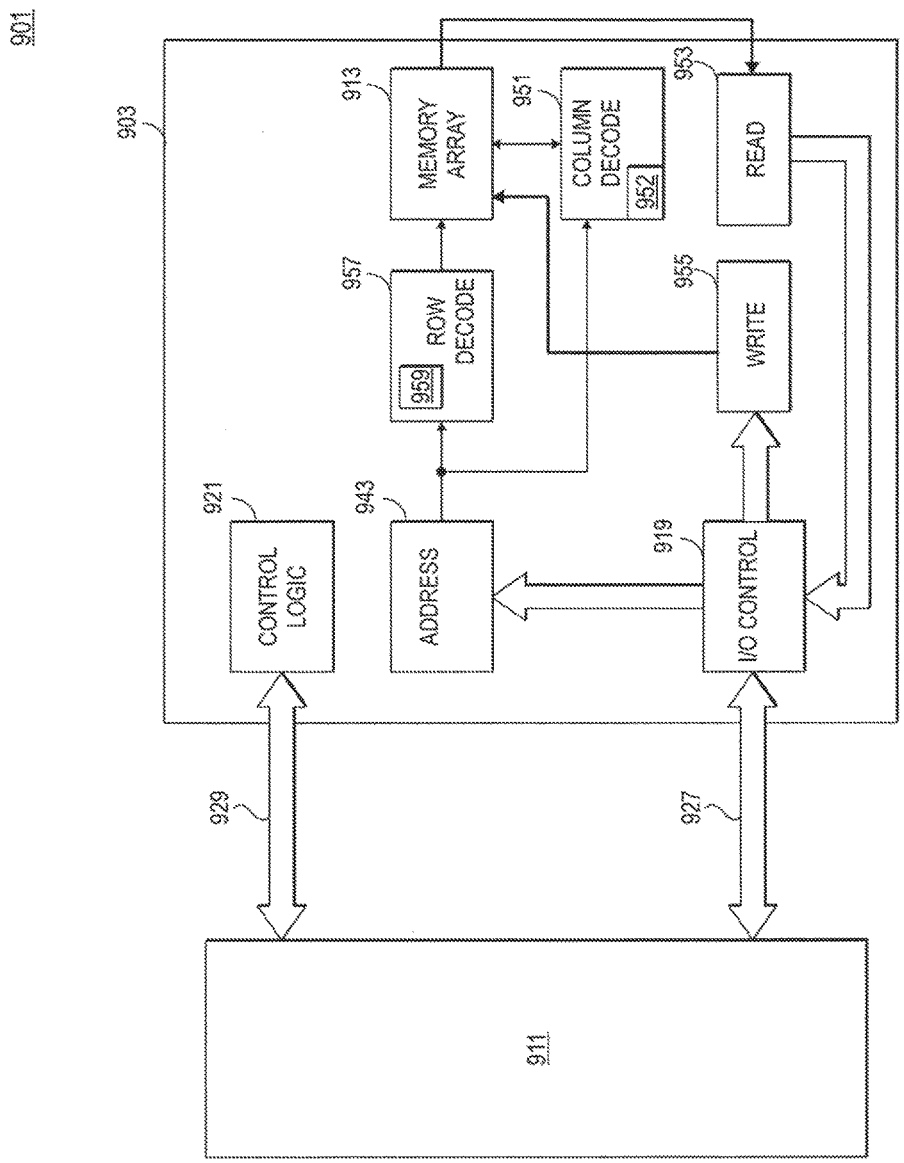
FIG. 5 is a diagram of a memory system including a decoder according to an illustrative embodiment of the disclosure.

FIG. 5 is a block diagram of a memory system including an address decoder according to an embodiment of the disclosure. The memory system includes a memory 903 according to an embodiment of the disclosure. Memory system 901 includes a memory access device 911 (e.g., processor, memory controller, etc.) coupled to the memory 903.

The memory 903 includes a memory array 913 of memory cells. The memory array 913 may include, for example, volatile memory cells (e.g., DRAM memory cells, SRAM memory cells), non-volatile memory cells (e.g., flash memory cells), or some other types of memory cells. In an embodiment of the disclosure, the memory array 913 includes non-volatile resistive memory cells, and the memory 903 is a resistive random access memory RRAM. The memory 903 and memory access device 911, can be implemented as separate integrated circuits, or the memory access device 911 and the memory 903 can be incorporated into the same integrated circuit, chip, or package. The memory access device 911 can be a discrete device (e.g., microprocessor) or some other type of process circuitry implemented in firmware, such as an application-specific integrated circuit (ASIC).

I/O connections 927 and control connections 929 include a communication interface between the memory access device 911 and the memory 903. The embodiment of FIG. 5 includes address circuitry 943 to latch address signals provided over the I/O connections 927 through I/O control circuitry 919. Address signals are received and decoded by a row address decoder circuit 957 and a column address decoder circuit 951 to access the memory array 913. The row address decoder circuit 957 and/or the column address decoder circuit 951 may include an address decoder 952, 959 in accordance with one or more embodiments of the disclosure. In light of the present disclosure, it will be appreciated by those having ordinary skill in the art that the number of address input connections depends on the density and architecture of the memory array 913 and that the number of addresses increases with both increased numbers of memory cells per memory array, an increased number of memory blocks, and/or an increased number of memory arrays. The reader will also appreciate that more address information may be needed to specify a particular portion of the memory array as the size of the memory array increases.

The read circuitry 953 can read data from the memory array 913. I/O control circuitry 919 is included for bi-directional data communication over the I/O connections 927 with the memory access device 911. Write circuitry 955 is included to write data to the memory array 913.

Control logic circuitry 921 decodes signals provided by control connections 929 from the memory access device 911. These signals can include chip signals, write enable signals, and address latch signals that are used to control the operations on the memory 903, and of the memory array 913, including data reading and data writing. The control logic circuitry 921 may provide a signal to the polarity line (not shown) and control the polarity of the select lines (not shown) such that current may be allowed to flow in different directions through certain memory cells during different phases of operation.

The control logic circuitry 921 can send signals to selectively set particular registers and/or sections of registers, or latch data in one or more registers. In one or more embodiments, the control logic circuitry 921 is responsible for executing instructions received from the memory access device 911 to perform certain operations on some portion of the memory cells of the memory array 913. The control logic circuitry 921 can be a state machine, a sequencer, or some other type of logic controller. It will be appreciated by those having ordinary skill in the art that additional circuitry and control signals can be provided, and that the memory device detail of FIG. 5 has been reduced to facilitate ease of illustration.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends on the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method for decoding an address, comprising:
receiving address information corresponding to an access line associated with an address decoder circuit, the address information based on the address being decoded;
receiving a polarity signal with the address decoder circuit;
coupling the access line to at least one of a first select line or a second select line, based, at least in part, on the address information and the polarity signal having a first logic level; and
switching the coupling of the access line to the at least one of the first select line or the second select line; based, at least in part, on the address information and the polarity signal having a second logic level.

2. The method of claim 1, further comprising providing an output signal having a first value responsive to the address information having a combination of logic levels and the polarity signal having a first polarity value, the output signal having a second value responsive to the address information having the combination of logic levels and the polarity signal having a second polarity value.

3. The method of claim 2, further comprising applying at least one of a first voltage or a second voltage to the access line based, at least in part, on whether the output signal has the first value or the second value.

4. The method of claim 3, further comprising coupling the output signal to a gate of a first transistor and a gate of a second transistor.

5. The method of claim 4, further comprising applying the first voltage and the second voltage at source terminals of the first transistor and the second transistor, respectively.

6. The method of claim 5, further comprising coupling a drain of the second transistor to the access line.

7. The method of claim 1, further comprising:
receiving an address corresponding to a second access line with a second address decoder circuit;
receiving a signal with the second address decoder circuit indicating a polarity of a third select line and a fourth select line; and
coupling the second access line with the second address decoder circuit to at least one of the third or fourth select line, based at least in part, on the address corresponding to the second access line and the polarity signal.

8. The method of claim 7 wherein a memory cell is coupled to the access line and the second access line.

9. The method of claim 8 further comprising, flowing current through the memory cell in a direction, the direction of the current based, at least in part, on a logic level of the polarity line.

10. The method of claim 8, further comprising switching voltages of the first and second select lines.

11. An apparatus, comprising:
a predecode circuit configured to receive address information and a polarity signal, wherein the address information is based on an address being decoded, the predecode circuit operable to provide an output signal having a first value responsive to the address information having a combination of logic levels, the polarity signal having a first polarity value and the output signal having a second value responsive to the address information having the combination of logic levels and the polarity signal having a second polarity value; and
a select circuit configured to receive the output signal, the select circuit operable to provide a voltage having a first polarity responsive to the output signal having the first value and a second polarity responsive to the output signal having the second value.

12. The apparatus of claim 11, wherein the predecode circuit comprises a plurality of logic gates configured to provide the output signal having the first value.

13. The apparatus of claim 12, wherein the select circuit comprises a first transistor and a second transistor, the output signal of the plurality of logic gates coupled to a gate of the first transistor and a gate of the second transistor.

14. The apparatus of claim 13, wherein the first transistor is a p-type transistor.

15. The apparatus of claim 13, wherein the second transistor is an n-type transistor.

16. The apparatus of claim 13, wherein a source of the first transistor is coupled to a source of the first voltage and a source of the second transistor is coupled to a source of the second voltage.

17. The apparatus of claim 13, wherein the predecode circuit is coupled to a polarity line.

18. The apparatus of claim 17, wherein the predecode circuit comprises an XOR gate having a first input terminal coupled to the polarity line, the plurality of logic gates configured to decode the address information and provide a signal to a second input terminal of the XOR gate.

19. The apparatus of claim 13, wherein the select circuit is coupled to the predecode circuit and to an access line.

20. The apparatus of claim 19, wherein a drain of the first transistor is coupled to a drain of the second transistor and to the access line.

* * * * *

UNITED STATES PATENT AND TRADEMARK OFFICE
CERTIFICATE OF CORRECTION

PATENT NO. : 10,163,501 B2  
APPLICATION NO. : 15/684784  
DATED : December 25, 2018  
INVENTOR(S) : Stephen H. Tang Page 1 of 1

It is certified that error appears in the above-identified patent and that said Letters Patent is hereby corrected as shown below:

In the Claims

| | Reads | Should Read |
|---|---|---|
| Column 9, Line 57 | "switching the coupling of the access line to the at least one of the first select line or the second select line; based, at least in part, on the address information and the polarity signal having a second logic level." | --switching the coupling of the access line to the at least one of the first select line or the second select line, based, at least in part, on the address information and the polarity signal having a second logic level.-- |

Signed and Sealed this  
Twenty-sixth Day of March, 2019

Andrei Iancu  
*Director of the United States Patent and Trademark Office*